(12) United States Patent
Mu et al.

(10) Patent No.: US 8,792,581 B2
(45) Date of Patent: Jul. 29, 2014

(54) RF CLOCK GENERATOR WITH SPURIOUS TONE CANCELLATION

(75) Inventors: Fenghao Mu, Hjärup (SE); Henrik Sjöland, Loddeköpinge (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 676 days.

(21) Appl. No.: 12/708,345

(22) Filed: Feb. 18, 2010

(65) Prior Publication Data
US 2011/0200076 A1 Aug. 18, 2011

(51) Int. Cl.
*H03K 9/00* (2006.01)
*H04L 25/49* (2006.01)

(52) U.S. Cl.
USPC ............ 375/296; 375/316; 375/297; 375/373

(58) Field of Classification Search
USPC ......... 375/285, 284, 278, 295, 296, 297, 316, 375/346, 345, 344, 362, 219, 222, 229, 375/240.26–240.29, 299, 318, 319, 324, 375/325, 326, 338, 339, 340, 304, 306, 307, 375/347, 350, 354, 373–376, 371, 364; 455/91, 114.2, 114.3, 115.1
See application file for complete search history.

(56) References Cited

U.S. PATENT DOCUMENTS

| | | | |
|---|---|---|---|
| 6,954,621 B2 * | 10/2005 | Bauernschmitt et al. | 455/126 |
| 2002/0044014 A1 | 4/2002 | Wright et al. | |
| 2002/0046328 A1 * | 4/2002 | Okada | 711/151 |
| 2002/0101937 A1 | 8/2002 | Antonio et al. | |
| 2006/0068748 A1 | 3/2006 | Irie et al. | |
| 2007/0090999 A1 * | 4/2007 | Han et al. | 343/700 MS |
| 2007/0123182 A1 | 5/2007 | Dekker | |
| 2008/0152037 A1 * | 6/2008 | Kim et al. | 375/297 |
| 2008/0211576 A1 * | 9/2008 | Moffatt et al. | 330/149 |
| 2008/0253477 A1 * | 10/2008 | Dalipi | 375/297 |
| 2010/0004018 A1 * | 1/2010 | Demir et al. | 455/522 |

(Continued)

FOREIGN PATENT DOCUMENTS

| | | |
|---|---|---|
| GB | 2272133 A | 5/1994 |
| GB | 2351624 A | 1/2001 |

(Continued)

OTHER PUBLICATIONS

T. Nesimoglu et al., "Interference Suppression in Radio Receivers by Using Frequency Retranslation", IEEE 978-1-4244-4565-3, printed on Dec. 2, 2009, 5 total pages.
EPO, European Search Report in EP11154102, Jun. 27, 2013.

*Primary Examiner* — Sam K Ahn
*Assistant Examiner* — Linda Wong
(74) *Attorney, Agent, or Firm* — Patent Portfolio Builders PLLC

(57) ABSTRACT

A clock generator circuit may generate a target clock signal and may include a pattern generator to generate a pre-distorted version of a modulation signal from patterns stored by the pattern generator. An up-converter may up-convert the pre-distorted version of the modulation signal and a radio frequency lock oscillator signal to obtain an RF clock signal having a desired frequency tone. A tone detection circuit may receive the RF clock signal and detect a presence of unwanted tones. A controller may write the patterns corresponding to the pre-distorted version of the modulation signal to the pattern generator based on the detected unwanted tones in the RF clock signal.

13 Claims, 13 Drawing Sheets

(56) References Cited

U.S. PATENT DOCUMENTS

2010/0097137 A1* 4/2010 Hou et al. ............... 330/149
2010/0233977 A1* 9/2010 Minnis et al. ........... 455/127.1
2011/0001877 A1* 1/2011 Pugel ...................... 348/565
2011/0163806 A1* 7/2011 Hongo .................... 330/149

FOREIGN PATENT DOCUMENTS

| WO | WO 04/001992 A1 | 12/2003 |
| WO | WO 2009/060407 A1 | 5/2009 |
| WO | 2009/072071 A1 | 6/2009 |

* cited by examiner

RF CLOCK GENERATOR WITH SPURIOUS TONE CANCELLATION

TECHNICAL FIELD

Embodiments described herein relate generally to radio frequency (RF) communication devices, and, more particularly, to the generation of RF clock signals by an RF communication device.

BACKGROUND

In RF communication systems, clock signals may be used for a number of different purposes. RF communication systems require good clock signals to work properly.

In an RF mobile terminal, RF clock signals may be created on-chip by phase-locked-loops (PLLs) locking at an external crystal resonator as a reference clock input with different dividing factors. For transmitter and receiver circuits running at different frequencies, normally at least two PLLs are needed in an RF integrated circuit (IC). For some mobile terminals, such as mobile terminals that support multiple RF communication standards (e.g., WLAN, Bluetooth, GPS, etc.) additional RF clock signals, and hence additional PLLs, may be needed. Further, in some suggested radio standards, in order to increase communication data rate, carrier aggregation is suggested, in which additional RF clock signals may be required.

Creating many RF clocks using PLLs, however, is not an easy task. When several PLLs are integrated into a single chip, it can become problematic as the PLLs may interfere with each other, degrading the performance of the PLLs. Interference between PLLs may depend on the physical distance between the PLLs and the frequency difference between the PLLs.

Techniques are known for creating additional RF clock signals without adding a new PLL. One such technique uses an up-converter to convert input modulation clock signals and a local RF clock signal into the desired RF clock signal, where the frequency of the desired RF clock signal, $f_c$, is equal to either $f_0+f_m$ or $f_0-f_m$. For simplicity, here we only discuss the situation in which $f_c=f_0+f_m$, assuming that $f_m$ can be either positive or negative. Here, $f_o$ is the frequency of the local RF clock signal and $f_m$ is the fundamental frequency of the input modulation clock signal. In practice, however, the signal output from the up-converter is not an ideal signal, and instead of creating a single tone clock signal spectrum, it may also generate undesired tones in its spectrum, expressed as:

$$S(f) = \sum_{i=0}^{ni} \sum_{j=-nj}^{nj} \beta_{ij} \delta(f - i \cdot f_0 - j \cdot f_m).$$

In this equation, i, j, $n_i$ and $n_j$ are integers. The energy of the clock signal created is limited, so $\beta_{ij}$ can become extremely small for large i and j. Setting $n_i$ and $n_j$ to five would, in most cases, be sufficient to account for most significant tones. When i=1 and j=1, the tone for the created clock signal, the desired tone, $f_c=f_0+f_m$, is generated. Similarly, when i=1 and j=−1, the tone for the created clock signal, the desired tone, $f_c=f_0-f_m$, is generated. The other created tones are spurious tones (i.e., unwanted tones). The most harmful of these tones may be the tones that are close to the created clock tone. For example, when i=1 and j=1 is the desired clock tone, the tones created at i=1 and j={−5, −4, −3, −2, −1, 0, 2, 3, 4, 5} are harmful. Here, these tones are referred to as modulation tones, as they are created by the non-linearity in handling the modulation signal. Other tones, created when i≠1, are referred to as harmonic tones, and they are normally located at the centers or neighborhood of the harmonics of RF clock $f_0$.

When generating additional RF clock signals using an up-converter, it is desirable to eliminate the undesirable modulation and harmonic tones as much as possible.

SUMMARY

It is an object of the invention to overcome at least some of the above disadvantages, and to provide for clock generation circuits that can generate a number of high quality RF clock signals.

An embodiment described herein may provide for a clock generation circuit to generate a target clock signal. The clock generation circuit may include a pattern generator to generate a pre-distorted version of a modulation signal from patterns stored by the pattern generator. An up-converter may up-convert the pre-distorted version of the modulation signal using a radio frequency local oscillator signal to obtain an RF clock signal having a desired frequency tone. A tone detection circuit may receive the RF clock signal and detect amplitudes and phases corresponding to a presence of unwanted tones. A controller may generate pre-distortion data based on the detected amplitudes and phases and control the pattern generator to generate the pre-distorted version of the modulation signal based on the pre-distortion data.

In some implementations, a notch filter may be implemented to filter the RF clock signal, where the notch filter is constructed to suppress a third order harmonic tone of the RF clock signal, for reducing the inter-modulation introduced by following digital gate, such as clock driver or divider.

In one possible embodiment, the RF clock signal or filtered RF clock signal may be down-converted to low frequency and sampled by an ADC or a sample-and-hold circuit to detect the unwanted tones.

Another possible embodiment described herein may provide a method of producing an RF clock signal. The method may include mixing a pre-distorted modulation signal and a radio frequency local oscillator signal, to obtain the RF clock signal having a desired frequency tone. Unwanted, spurious frequency tones in the RF clock signal may be detected. Pre-distortion data, based on the detected unwanted frequency tones, may be generated. Data patterns, based on the pre-distorted data, may be written to a memory, data patterns, when read out from the memory, may include amplitude and phase values designed to cancel the unwanted frequency tones in the RF clock signal.

Another embodiment described herein may include a mobile terminal that includes an antenna; a processing system to control the operation of the mobile terminal; and a transceiver component, connected to the processing system and the antenna, to wirelessly send and receive data. The transceiver component may include a clock generation circuit for generating an RF clock signal. The clock generation circuit may include an up-converter to up-convert a pre-distorted modulation signal using a radio frequency local oscillator signal to obtain the RF clock signal having a desired frequency tone. A pattern generator may generate the pre-distorted modulation signal to cancel effects of non-linearities of the up-converter. A tone detection circuit may receive the RF clock signal and detect unwanted tones in the RF clock signal.

A controller may control the pattern generator to generate the pre-distortions in the modulation signal based on the detected unwanted tones.

In some implementations, the pattern generator may be implemented using a number of random access memories (RAMs), each of the random access memories storing a pattern corresponding to a tone. An adder may digitally sum outputs of each of the random access memories to generate the pre-distorted version of the modulation signal.

In some implementations, the pattern generator may include a first random access memory to store the patterns, each of the patterns corresponding to one of the unwanted modulation tones; a second random access memory to store pre-distortion data corresponding to one of the tones; and an adder for digitally summing outputs from the first random access memory and the second random access memory, where at least some of the outputs of the adder are written back to the first random access memory for updating the patterns.

In general, the pattern generator may include a pair of pattern generators to respectively generate the pre-distorted version of the modulation signals for an in-phase channel and quadrature channel. In each channel, a digital-to-analog converter may receive a pre-distorted version of a modulation signal from the pattern generator and output an analog version of the pre-distorted modulation signal. A low pass filter may receive the analog version of the pre-distorted modulation signal and output a low pass filtered signal to the up-converter.

In some implementations, the controller of the clock generation circuit may control the tone detection circuit to detect the amplitudes and phases during initial calibration or operation mode test of the clock generation circuit. The controller of the clock generation circuit may control the tone detection circuit to sequentially detect the presence of a number of the unwanted tones in the RF clock signal or the filtered version of the RF clock signal, and modify the pre-distorted pattern stored in random access memory, to meet spectrum mask requirements.

In some implementations, the tone detection circuit of the clock generation circuit may include a first mixer to receive the RF clock signal or a filtered version of the RF clock signal as an input signal and down-convert the input signal based on a radio frequency local oscillator signal to create a baseband representation of the unwanted tones; and a second mixer to further down convert one of the baseband tones into a DC signal. From in-phase (I) and quadrature phase (Q) channels, the amplitude and phase of one of the down-converted unwanted tones may be sampled as residual error signals corresponding to the unwanted tones. Based on the residual error signals, the controller may modify the pre-distorted pattern to minimize the amplitudes of the unwanted tones.

In some implementations, a combiner may combine the down-converted RF clock signal with the modulation signal to remove the down-converted wanted tone in the RF clock signal.

In some implementations, the pattern generator may include a random access memory to store patterns corresponding to the modulation signal, where the stored patterns include at least one stored pattern for each unwanted tone detected by the tone detection circuit.

In some implementations, the controller may control the tone detection circuit to detect the amplitudes and phases of the unwanted tones during initial calibration or operation mode test of the clock generation circuit.

In some implementations, the controller may control the tone detection circuit to sequentially detect the presence of a plurality of the unwanted tones in the RF clock signal.

In some implementations, the tone detection circuit may include a first mixer to receive the RF clock signal as an input signal and also use the RF clock signal as the radio frequency local oscillator signal, thereby forming a self-mixing, to down convert the RF clock signal.

In some implementations, the tone detection circuit may include a first mixer to down-convert the RF clock signal, a sample-and-hold circuit to sub-sample the down-converted RF clock signal, and an analog-to-digital converter to convert the sampled signal to generate the pre-distortion data.

In some implementations, the tone detection circuit may include in-phase and quadrature channel, each comprising a first mixer to down-convert the RF clock signal, a sample-and-hold circuit to sub-sample the down-converted RF clock signal, and an analog-to-digital converter to convert the sampled signal to generate the pre-distortion data.

Systems and/or methods described herein may provide for the generation of a clock signal, such as an RF clock signal, using an input RF local oscillator signal and a lower frequency modulation signal. Multiple different clock signals may be generated based on the RF local oscillator signal in which tone cancellation is applied to the generated clock signals to clean unwanted tones in the clock signals.

DETAILED DESCRIPTION

The following detailed description refers to the accompanying drawings. The same reference numbers in different drawings may identify the same or similar elements. Also, the following detailed description does not limit the invention.

Figure 1:
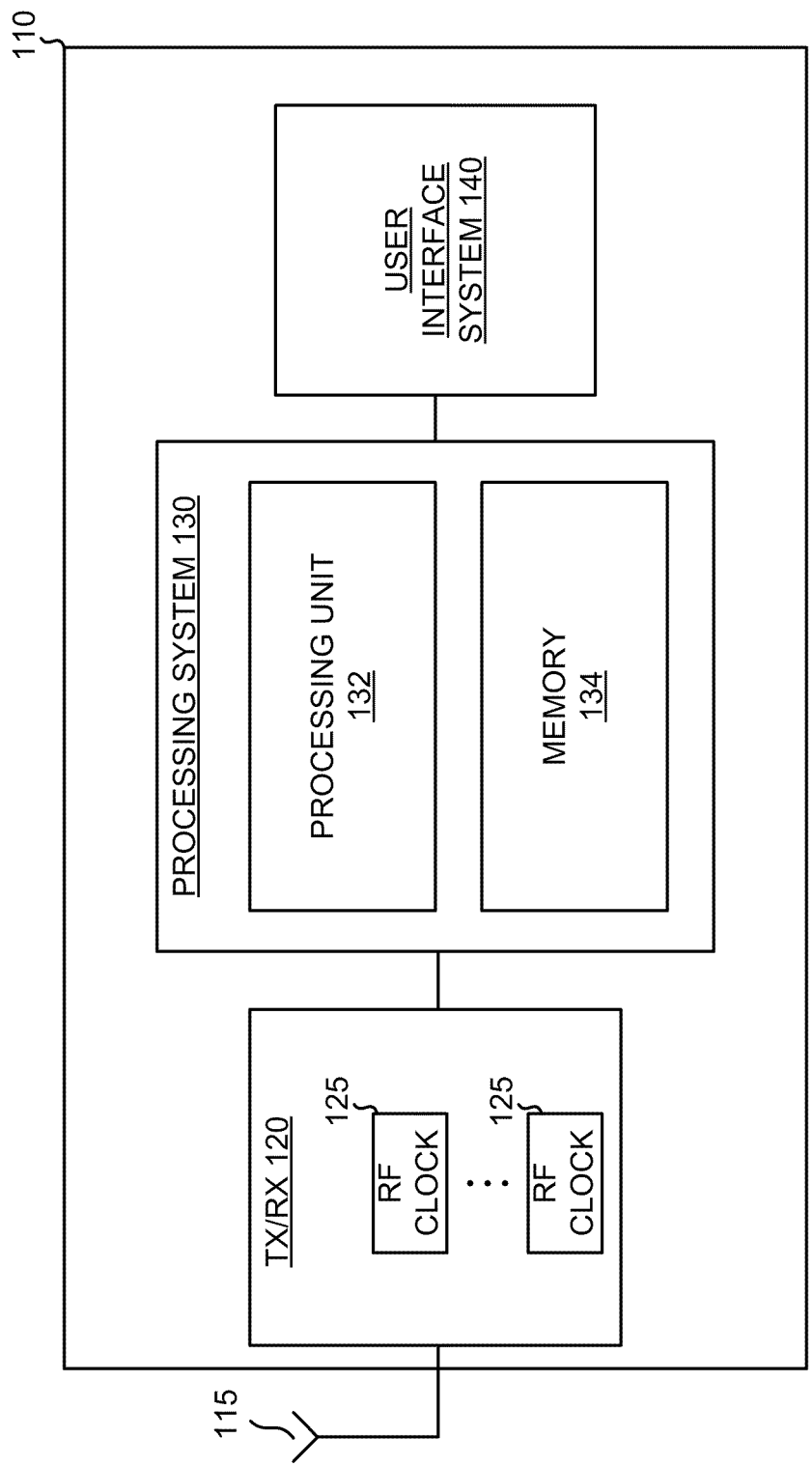
FIG. 1 is a diagram of exemplary device where an RF clock generation circuit and method described herein may be implemented.

FIG. 1 illustrates a diagram of an exemplary device 110, such as user equipment (UE), in which an RF clock signal generator may be implemented. As shown in FIG. 1, UE 110 may include an antenna 115, transceivers (TX/RX) 120, a processing system 130, and a user interface system 140.

Device 110 may particularly be, for example, a mobile terminal in a wireless communication network.

Antennas 110 may include one or more omni-directional antennas. Transceivers 120 may be associated with antennas 115 and may include transceiver circuitry for wirelessly transmitting and/or receiving data with a base station in the wireless network. Transceivers 120 may particularly include one or more RF clock signal generator circuits 125 that each generate a periodic RF clock signal. Each of RF clock signal generator circuits 125 may generate its clock signal based on a single set of local quadrature RF clock signals, such as generated using a PLL, and a low frequency modulation signal. RF clock signal generator circuits 125 may share the input set of local quadrature RF clock signals, thus allowing a number of RF clock signals to be generated without each signal requiring a PLL. Implementations of RF clock signal generator circuits 125 will be described in more detail below.

Processing system 130 may control the operation of UE 110. Processing system 130 may process information received via transceiver 120 and/or user interface system 140. As illustrated in FIG. 1, processing system 130 may include a processing unit 132 and a memory 134. Processing unit 132 may include one or more processors, microprocessors, application specific integrated circuits (ASICs), field programmable gate arrays (FPGAs), or the like. However, systems and/or methods described herein are not limited to any specific combination of hardware circuitry and software.

Although FIG. 1 shows exemplary components of UE 110, in other embodiments, UE 110 may contain fewer, different, differently arranged, or additional components than depicted in FIG. 1. Alternatively or additionally, one or more components of UE 110 may perform one or more other tasks described as being performed by one or more other components of UE 110.

RF Clock Circuit

Figure 2:
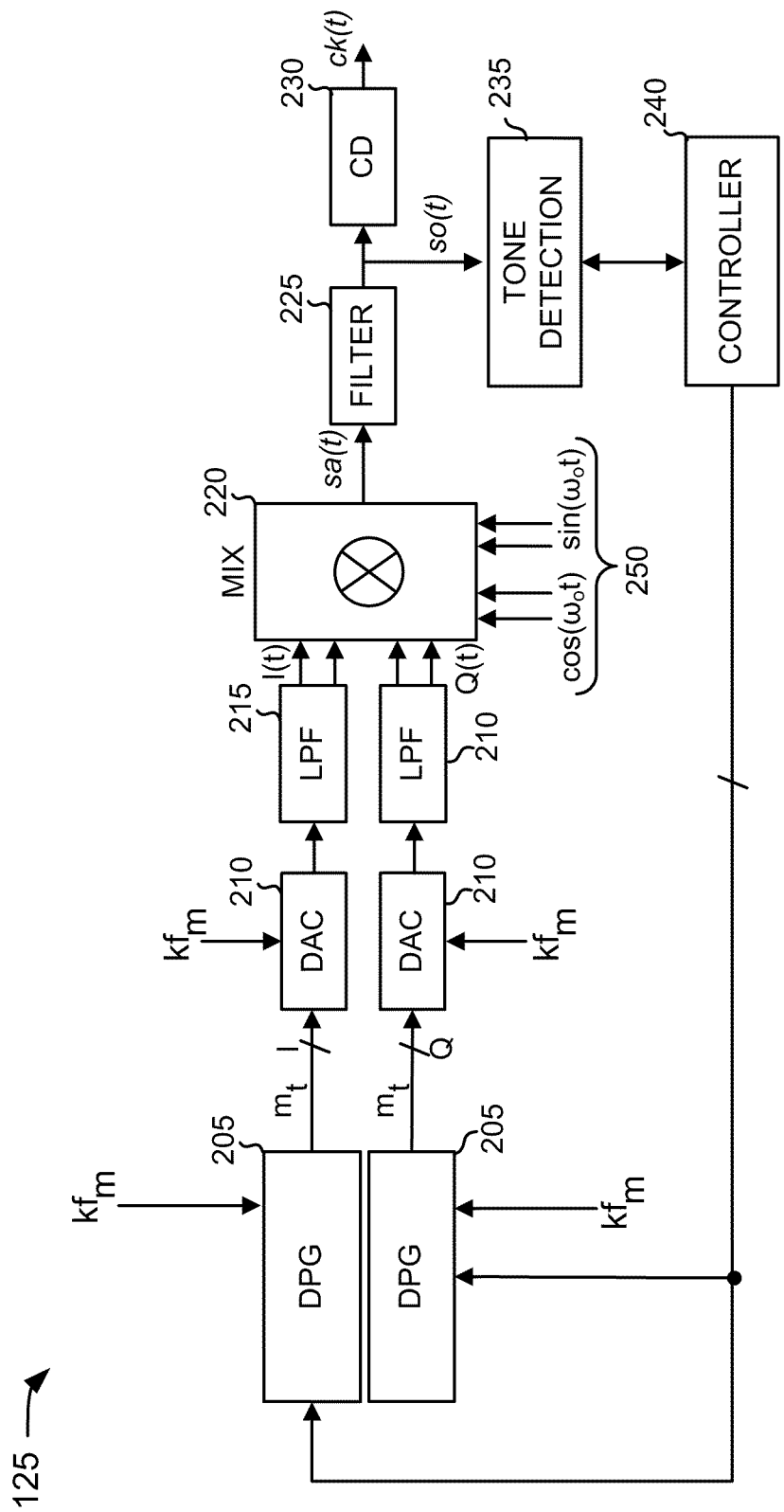
FIG. 2 is a diagram illustrating an exemplary implementation of an RF clock circuit.

FIG. 2 is a diagram illustrating an exemplary implementation of one of RF clock signal generator circuits 125. In general, an RF clock signal generator circuit 125 may use an up-converter to mix a low frequency modulation signal with a set of local quadrature RF clock signals to obtain an RF output clock signal. Tone cancellation is performed to reduce spurious tones in the output signal to obtain a high quality RF clock signal.

As particularly shown, RF clock signal generator circuit 125 may include two parallel connected channels, one for In-phase (I) channel and another for the quadrature (Q) channel. Each channel may include a digital pattern generator (DPG) 205, a digital-to-analog (DAC) converter 210, and a low pass filter (LPF) 215. RF clock signal generator circuit 125 also includes an up-converter (mixer, MIX) 220, a filter 225, and a clock driver or a clock divider (CD) 230. Additionally, feedback information from filter 225 may be received by tone detection circuit 235, the output of which may be received by controller 240. Controller 240 may control DPGs 205 based on the feedback to, for example, pre-distort the input modulation signal to compensate for nonlinearities of up-converter 220.

RF clock signal generator circuit 125 may generate the output RF clock signal, ck(t), having a desired frequency $f_c$, based on the low frequency input modulation signal having a fundamental frequency, $f_m$, and the local quadrature RF clock signals 250 ($f_o$). Local quadrature RF clock signals 250 may be generated using a PLL and may be input to a number of similarly constructed RF clock generator circuits 125 for generating a corresponding number of different RF output signals.

DPGs 205 may include a number of random access memories (RAMs), the accessing of which may be controlled by controller 240 and a low-frequency modulation signal $m_t$ with a fundamental frequency $f_m$ (or an integer multiple, K, of $f_m$). The digital modulation signal $m_t$ is created by DPGs 205 illustrated in FIG. 2 and may be directly read out at clock frequency $f_{ro}=K\,f_m$, where K is an oversampling factor. DPGs 205 may generate digital modulation signals $m_t$ for I and Q channels, which may represent digital patterns generated based on lookup operations into RAMs of DPGs 205. Because the I and Q channel patterns have phase shift of 90 degrees, a smart hardware arrangement for DPGs 205 can save hardware cost. The lookup operations may generate sinusoid signals with a desired amount of pre-distortion. Exemplary implementations of DPGs 205 will be described in more detail below.

DACs 210 may include two DACs, one for each of the I and Q channels output by DPGs 205. DACs 210 may operate to convert the digital signals into analog signals.

LPFs 215 may remove high frequency components from the input signals and output quadrature I(t) and Q(t) channels that are to be mixed with the local quadrature RF clock signals 250 that are also input to up-converter 220.

Up-converter 220 mixes the input clock signals and modulation signals to generate an output signal having a desired tone at $(f_o+f_m)$ or $(f_o-f_m)$ (where $f_o$ refers to a local oscillator RF signal). In practice, because of the non-idealities that the load impedance of up-converter 220 is not zero and the output impedance of the active components are not infinite, up-converter 220 normally behaves as a nonlinear transfer function that introduces unwanted harmonic tones and modulation tones. As a comparison, an ideal up-converter may convert the input modulation signals and the local quadrature RF clock signals 250 into the wanted clock signal based on the following equation:

$$\sin(\omega_0 t)\cdot\cos(\omega_m t)\pm\cos(\omega_0 t)\cdot\sin(\omega_s t)=\sin(\omega_0 t\pm\omega_m t)=\sin(\omega_c t). \quad (1)$$

The output signal in equation (1) contains only a single tone, the wanted clock signal. Here, $\omega_0=2\pi f_0$, $\omega_s=2\pi f_s$, and $\omega_c=2\pi f_c$, respectively.

Up-converter 220, as previously mentioned, may also create unwanted harmonic tones. The harmonic tones may be created at frequencies of $nf_o\pm mf_m$, where n and m are integers. The case when n=3 and m=1 may create a particularly strong $3^{rd}$ order harmonic tone, $f_{h3}$, at the output of up-converter 220. Note also that harmonic tones at $nf_c=nf_o\pm nf_m$ should not introduce problems because, as in a periodical pulse series, it has the fundamental frequency $f_c$ and harmonics as well.

Figure 3:
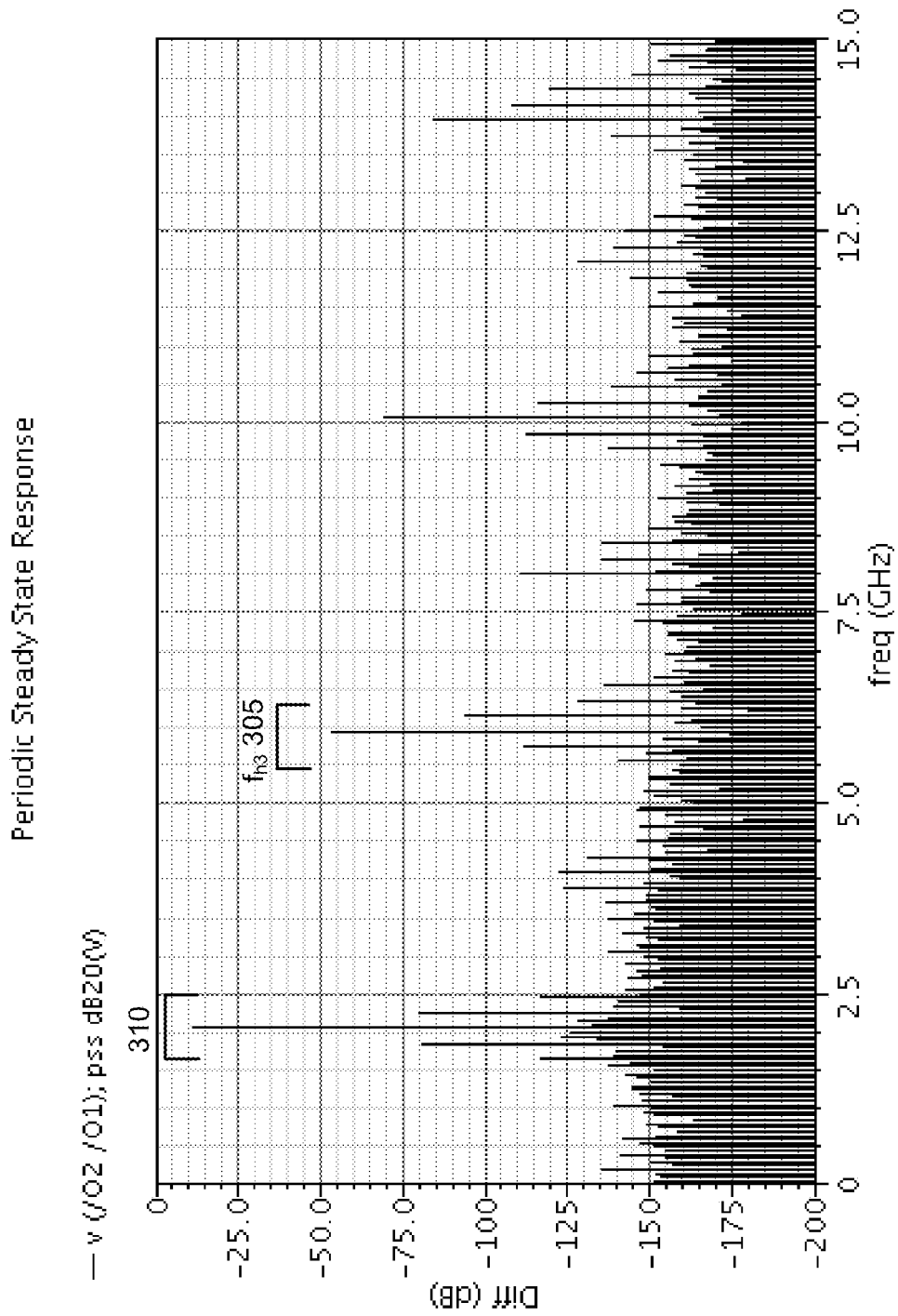
FIG. 3 is a diagram illustrating an exemplary spectrum of an up-converter.

FIG. 3 is a diagram illustrating an exemplary spectrum of a particular up-converter, such as up-converter 220. As shown in FIG. 3, where $f_0=2$ GHz, $f_m=50$ MHz and $f_c=2.05$ GHz, the harmonic tone, $f_{h3}=3\,f_0-f_m=5.95$ GHz, labeled 305 is about 40 dB lower than the created clock tone 310 at $f_c=2.05$ GHz. When a clock signal with a spectrum such as shown in FIG. 3 is fed into a digital gate, such as a clock driver CD 230, the harmonic tones may be mixed by the clock driver CD 230 as it is a strong nonlinear block, which creates unwanted tones which may also include harmful modulation tones.

Figure 4:
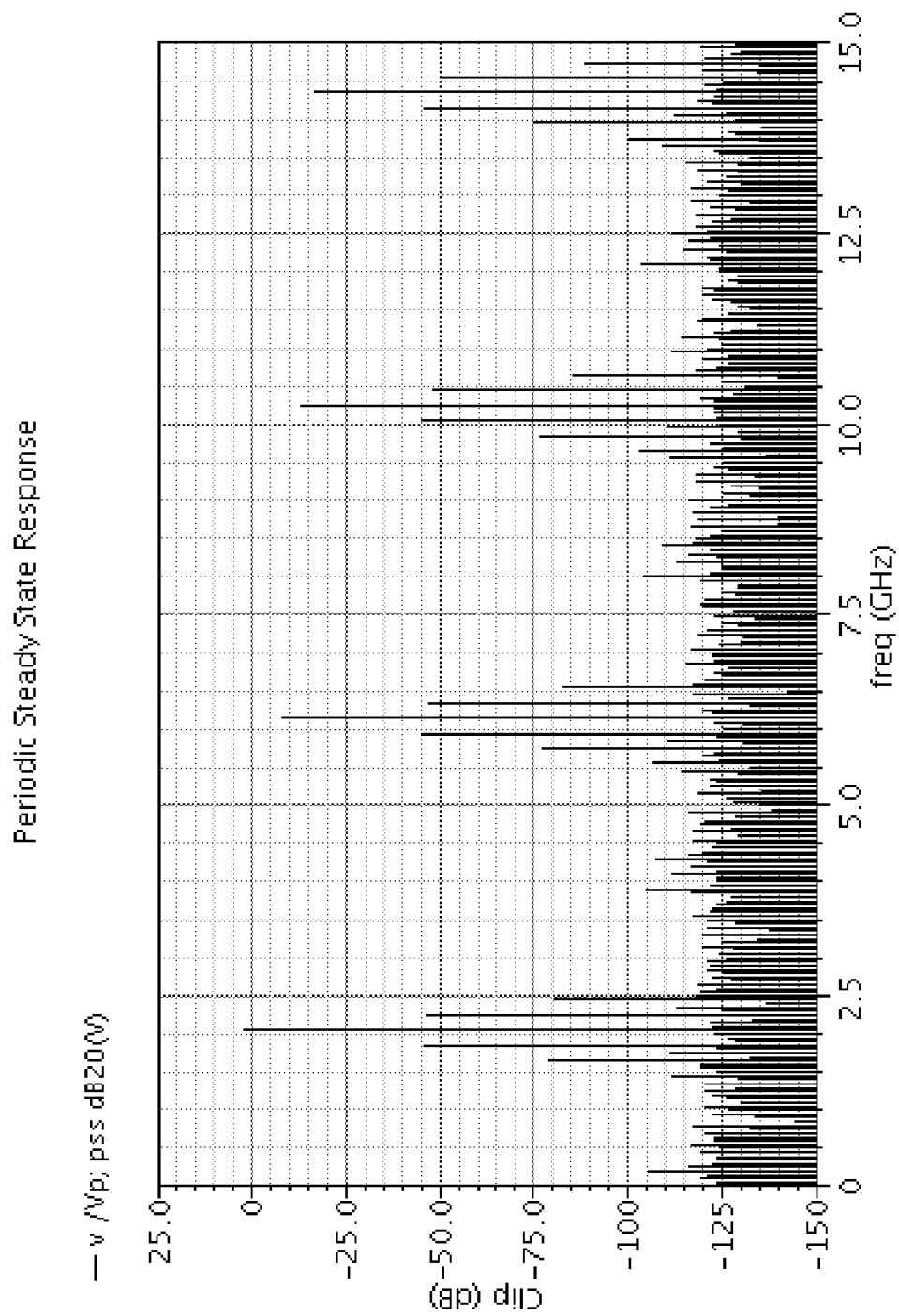
FIG. 4 is a diagram illustrating an exemplary spectrum of a clipped clock signal.

FIG. 4 is a diagram illustrating an exemplary spectrum of a clipped clock signal performed by a digital gate. The harmonic tone, $f_{h3}$, is weaker than that in FIG. 3. However, as shown, part of the power is down-converted into the harmful modulation tones close to the created clock, substantially increasing the amplitudes of the unwanted modulation tones.

Referring back to FIG. 2, filter 225 may include a bandpass filter and a notch filter. Filter 225 can particularly operate to suppress the $3^{rd}$ order harmonic tone before it is clipped by the digital gate CD 230. One possible implementation of filter 225 will be described in more detail below.

CD 230 converts its analog input signal into the desired RF digital clock signal, ck(t), having frequency $f_c$. CD 230 can also be a clock buffer or a clock divider or any other kind of digital gate. Clock driver and divider circuits are known and will not be described further herein.

Tone detection circuit 235 may receive the output of filter 225 and detect residual error information for one of the unwanted tones in the signal so(t), output from filter 225. Tone detection circuit 225 may, at different times, detect residual error information for different ones of the unwanted tones. Exemplary implementations of tone detection circuit 235 will be described in more detail below.

Controller 240 receives the residual error information from tone detection circuit 235 and, based on the residual error information, generates control signals to DPGs 205, which output the pre-distorted sinusoids used to cancel the unwanted tones. Controller 240 may be implemented in, for example, a digital signal processor (DSP), application specific integrated circuit (ASIC), or other hardware or hardware/software based component. The operation of controller 240 will be described in more detail below.

Although FIG. 2 shows exemplary components of an RF clock generator circuit 125, in other embodiments, RF clock generator circuit 125 may contain fewer, different, differently arranged, or additional components than depicted in FIG. 2.

Implementations of DPGs 205, up-converter 220, filter 225, and tone detection circuit 235 will now be discussed in additional detail with reference to FIGS. 5-13.

Figure 5:
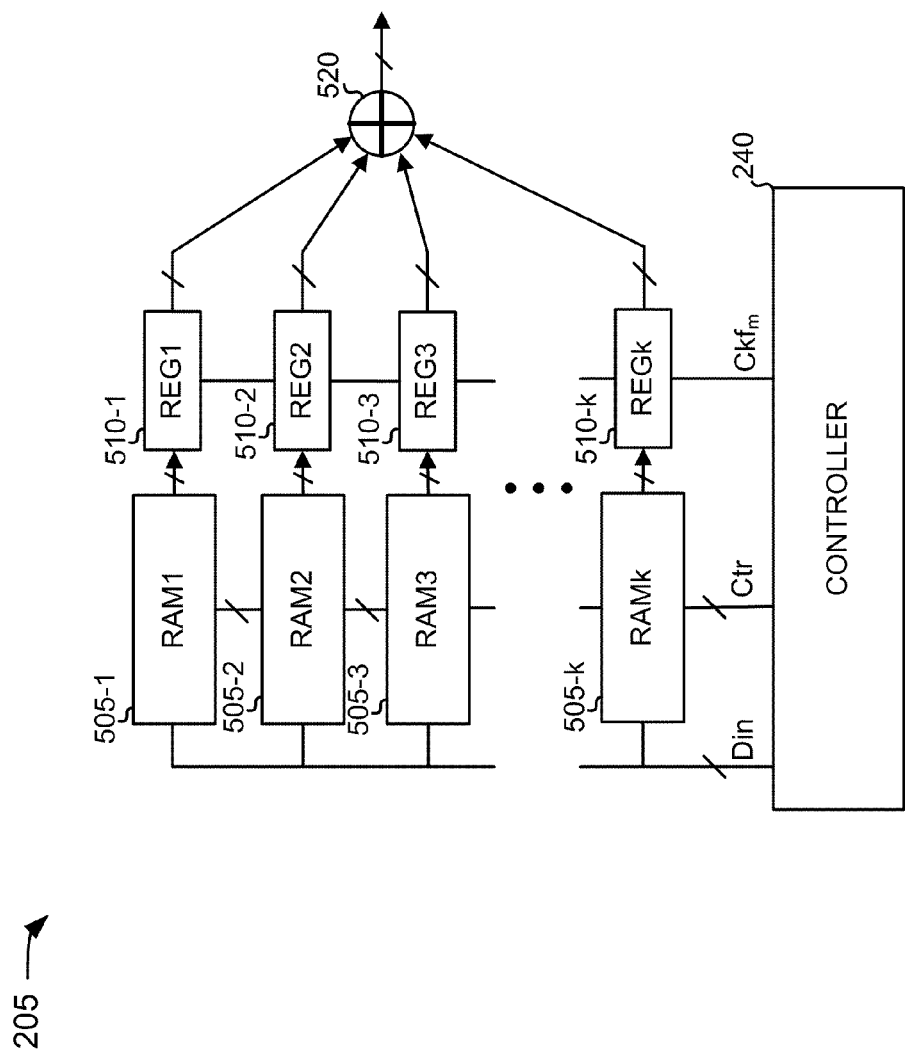
FIG. 5 is a diagram illustrating an exemplary implementation of a digital pattern generator.

FIG. 5 is a diagram illustrating an exemplary implementation of a DPG 205 for one channel. The second one of DPG 205 for another channel may be similarly implemented. As previously mentioned, each of DPGs 205 may operate to generate a pre-distorted modulation signal in which the distortion is controlled to reduce the nonlinearity of up-converter 220 and thereby suppress unwanted modulation tones.

As shown in FIG. 5, DPG 205 may include random access memories (RAMs) 505-1 through 505-k, the output of each of which may be connected to a corresponding buffer register 510-1 through 510-k. The output of registers 510 are input to adder 520. Adder 520 digitally sums its input value and output the sum result.

Each of RAMs 505 can be modified from an initial pattern representing the sinusoid modulation signals to updated patterns, that, when read out, as controlled by controller 240, represent pre-distorted sinusoid signals including tuned harmonics that are to be added to the sinusoid signal(s). The particular pre-distorted sinusoid signals at the output of a RAM 705 may be controlled by controller 240 based on the vector signals Din and Ctr. Din, for example, may represent data streams through which controller 240 may program RAMs 505 to include fundamental sinusoid signals and the pre-distortion signals, i.e, the harmonics of the fundamental sinusoid signals with proper phase and amplitude. Ctr may represent address lines through which controller 240 may select the values from RAMs to generate the desired pre-distorted signals or store the data stream Din into a selected RAM.

Registers 510 may receive the outputs of RAMs 505 and buffer the outputs before forwarding the outputs to adder 520. The clock signal $Ckf_m$ may be generated by controller 240 and used to trigger the latching of data from registers 510. In general, $Ckf_m$ is at a frequency $kf_m$, where k is an integer over-sampling ratio, which may be much larger than 1. Larger over-sampling ratio values k may result in greater accuracy to reach the desired phase alignment, especially for high order modulation cancellation tones. However, using large k values means increasing the frequency for the digital circuits. To get good phase alignment for higher order tones and maintain lower over-sampling ratios, one technique may include introducing several different tunable delay elements in the clock distribution for Ckfm.

In one implementation of RAMs 505, k may be five, i.e., DPG 205 may include five RAMs 505: RAM1 through RAM5. In this case, RAM1 may store the fundamental sinusoid signals, RAM2 may store a pre-distortion signal for eliminating local oscillator (LO) leakage, RAM3 may store a pre-distortion signal for eliminating $2^{nd}$ order distortion due to device mismatch, RAM4 may store a pre-distortion signal for eliminating $3^{rd}$ order distortion, and RAM5 may store a pre-distortion signal for eliminating $5^{th}$ order distortion.

The combined signal (e.g., the signal output from adder 520) may be kept symmetric on the I and Q axis. In this situation, the fundamental and pre-distorted signals can be expressed as $I=\sin(\omega_m t)$ $Q=\cos(\omega_m t)$ $I_3=c_3 \cdot \sin(3\omega_m t+\theta_3)$ $Q_3=-c_3 \cdot \cos(3\omega_m t+\theta_3)$ $I_5=c_5 \cdot \sin(5\omega_m t+\theta_5)$ $Q_5=c_5 \cdot \cos(5\omega_m t+\theta_5)$ where the minus sign in $Q_3$ is required to keep symmetry on the I and Q axis. Because the amplitudes of the distortion signals are much lower than the fundamental signals, the memory sizes for the pre-distortion signals are much smaller than for the fundamental signal. As a consequence, hardware area increasing due to the additional memory size is not a significant design factor.

Figure 6:
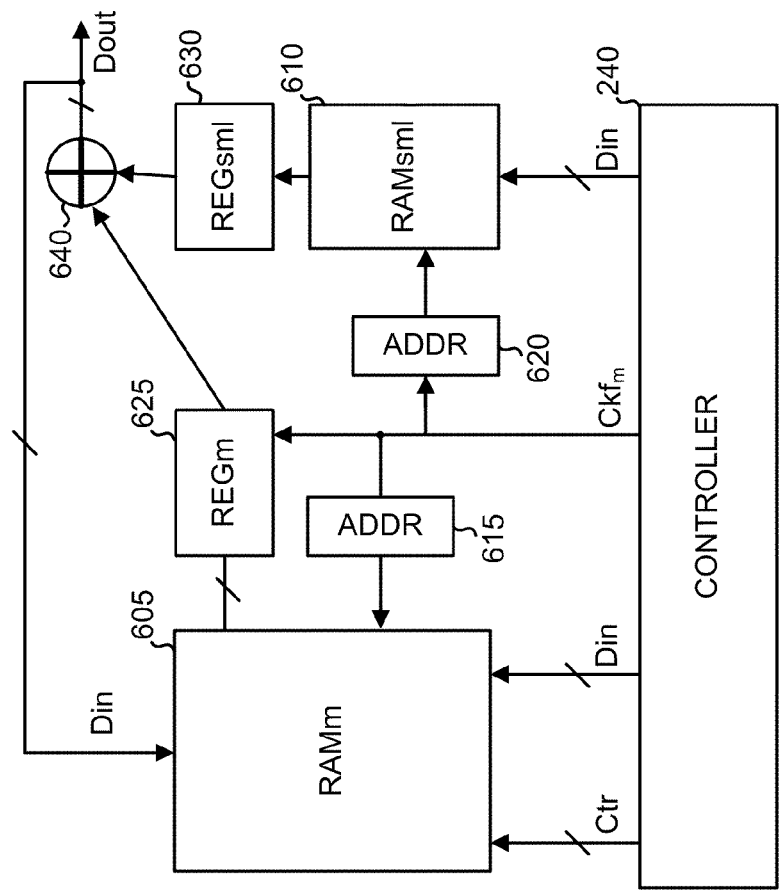
FIG. 6 is a diagram illustrating another exemplary implementation of a digital pattern generator.

FIG. 6 is a diagram illustrating a second possible exemplary implementation of one channel of DPGs 205. The second channel of DPGs 205 may be similarly implemented.

As shown in FIG. 6, DPG 205 may include random access memories RAMm 605 and RAMsml 610, address generators 615 and 620, registers 625 and 630, and an adder 640. RAMm 605 is the "main" memory in which patterns are stored and RAMsml 610 is a smaller RAM that may receive data from controller 240 (Din) during operation (i.e., during modulation tone cancellation). RAMm 605 may generally correspond to a merged version of RAMs 505 (FIG. 5). Address generators 615 and 620 provide addresses to RAMm 605 and RAMsml 610, respectively. Registers REGm 625 and REGsml 630 may connect to the outputs of RAMm 605 and RAMsml 610, respectively, to buffer the output values before the output values are summed by adder 640.

As shown, the input ports of RAMm 605 can be connected to receive write data, Din, from both controller 240 and the output, Dout, of adder 640, according to a configuration controlled by controller 240.

In operation, controller 240 may program RAMsml 610 to "tune" the amplitude and angle of the signal output from adder 640 so that one unwanted modulation tone in the RF clock signal is minimized. The output of adder 640 may then be sent to RAMm 605 to update the previous contents in RAMm 605. In this manner, unwanted modulation tones can be cancelled one-by-one, under the control of controller 240.

In some implementations, in RAMsml 610, the read-out initial address can be set to an offset, instead of zero to correspond to a time delay or a phase offset. Changing the initial offset address may lead to an initial phase change that can be used to tune the phase during calibration. In some implementations, a digital multiplier can also be inserted between register REGsml 630 and the RAMs 610, potentially allowing for the performance of amplitude tuning during an amplitude calibration operation. Phase calibration and amplitude calibration may be needed to eliminate unwanted tones. Phase calibration may be performed first, followed by amplitude calibration. Register REGsml may be triggered at a delayed clock phase of the clock signal Ckfm, with insertion of a variable delay element in the clock path (not shown).

Although FIGS. 5 and 6 show exemplary components of a DPG 205, in other embodiments, DPG 205 may contain fewer, different, differently arranged, or additional components than depicted in FIGS. 5 and 6.

Figure 7:
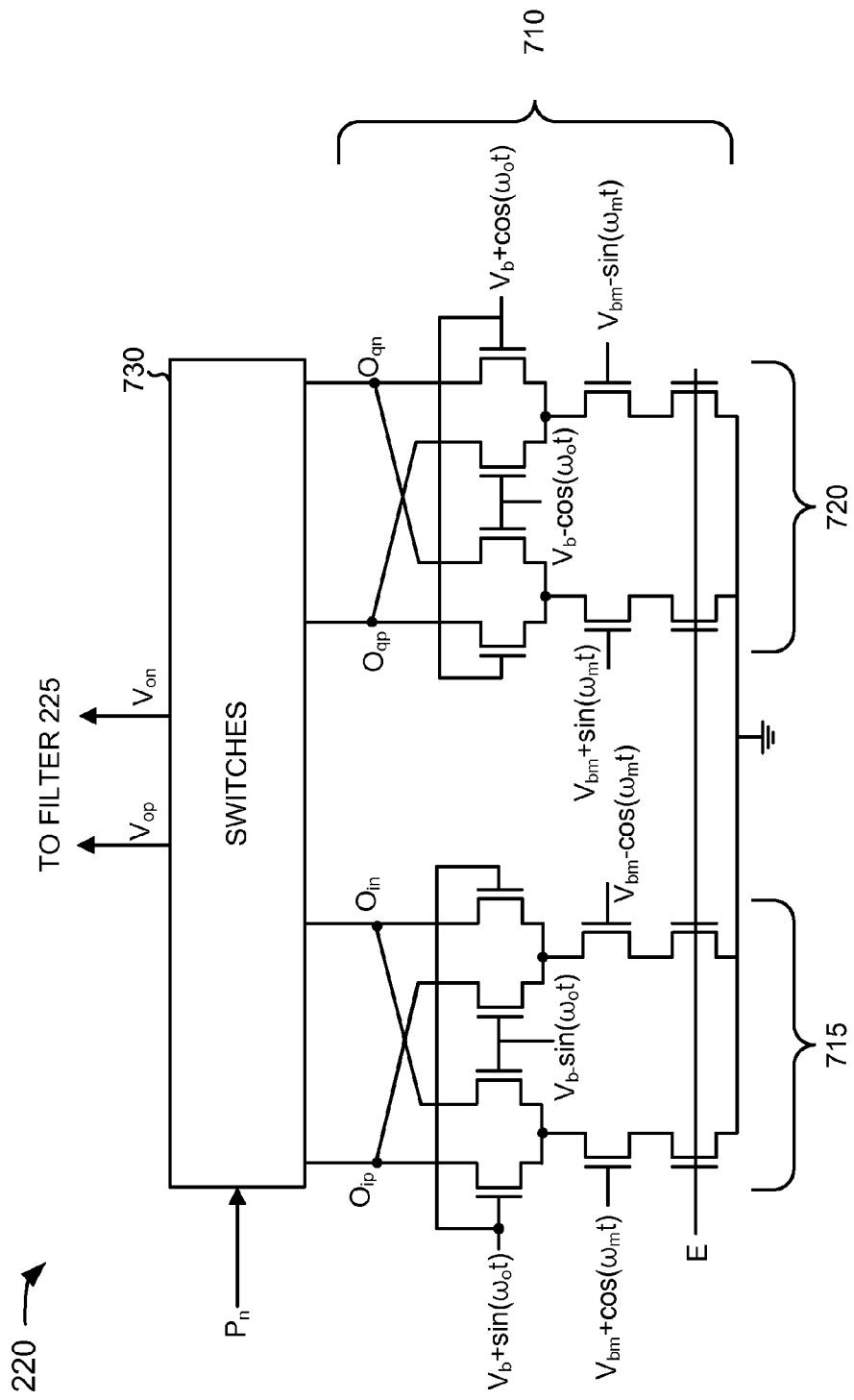
FIG. 7 is a diagram illustrating an exemplary implementation of an up-converter.

FIG. 7 is a diagram illustrating an exemplary implementation of up-converter 220. Up-converter 220 may be an up-converter based on the known Gilbert mixer topology. Up-converter 220 may include a double balanced mixer topology, which may give good cancellation of even order distortion and LO leakage.

As particularly shown in FIG. 7, up-converter 220 may include a double balanced mixer 710 and switches 730, which may be used to control the desired output frequency for the generated RF clock signal.

Double balanced mixer 710 may perform the up-conversion of the input signals. Double balanced mixer 710 may include a first section 715 and a second section 720. Each section 715 and 720 may include eight transistors, connected as shown. The output of first section 715 is labeled as nodes $O_{ip}$ and $O_{in}$. The output of second section 720 is labeled as nodes $O_{qp}$ and $O_{qn}$.

Switches 730 may select, based on the value of input pin $P_n$, how the nodes $O_{ip}$, $O_{in}$, $O_{qp}$, and $O_{qn}$ are selected for generating output at nodes $v_{op}$ and $v_{on}$. For example, when $P_n$ is logic high, switches 730 may connect node $v_{op}$ to nodes $O_{ip}$ and $O_{qn}$, and node $v_{on}$ to nodes $O_{in}$ and $O_{qp}$. In this case, the output of up-converter 220, after processing by filter 225, may generate a wanted RF clock signal of frequency at $f_o+f_m$. When $P_n$ is logic low, switches 730 may connect node $v_{op}$ to nodes $O_{ip}$ and $O_{qp}$, and node $v_{on}$ to nodes $O_{in}$ and $O_{qn}$. Controller 240 may control the value of $P_n$. In this case, the output of up-converter 220, after processing by filter 225, may generate a wanted RF clock signal of frequency at $f_o-f_m$. Control signal E may act as an enable signal, that, depending on its value, either enables or disables up-converter 220.

Figure 8:
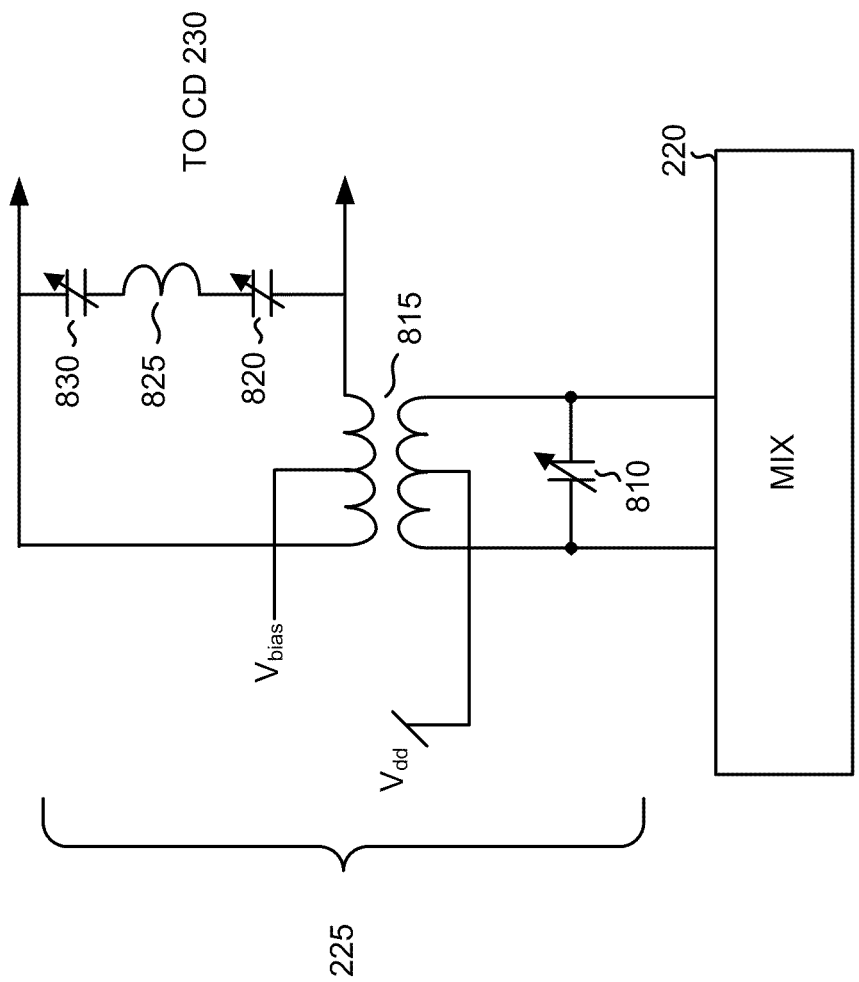
FIG. 8 is a diagram illustrating an exemplary implementation of a filter.

FIG. 8 is a diagram illustrating an exemplary implementation of filter 225. Filter 225 may generally operate to suppress the $3^{rd}$ order harmonic tone before digital clipping by the clock driver or other kind of digital gate CD 330. Filter 225 may implement a band pass filter and a notch filter.

Filter 225 may particularly include capacitor 810, transformer 815, capacitor 820, inductor 825, and capacitor 830. Capacitors 810, 820, and 830 may be tunable capacitors that can be tuned by controller 240.

In one implementation, capacitor 810 may be tuned so that capacitor 810 and primary coil of transformer 815 are at the target clock frequency, $f_c$, which may yield a maximum gain at $f_c$ for the band pass filter. Capacitors 820 and 830, and inductor 825 may be tuned separately to the 3rd order harmonic frequency. An alternative possible technique for tuning filter 225 may include actively tuning capacitor 810 to $f_c$ and passively tuning capacitors 820 and 830 based on the tuning of capacitor 810. For example, the same control word from controller 240 may be used to tune capacitors 810, 820, and 830.

Figure 9:
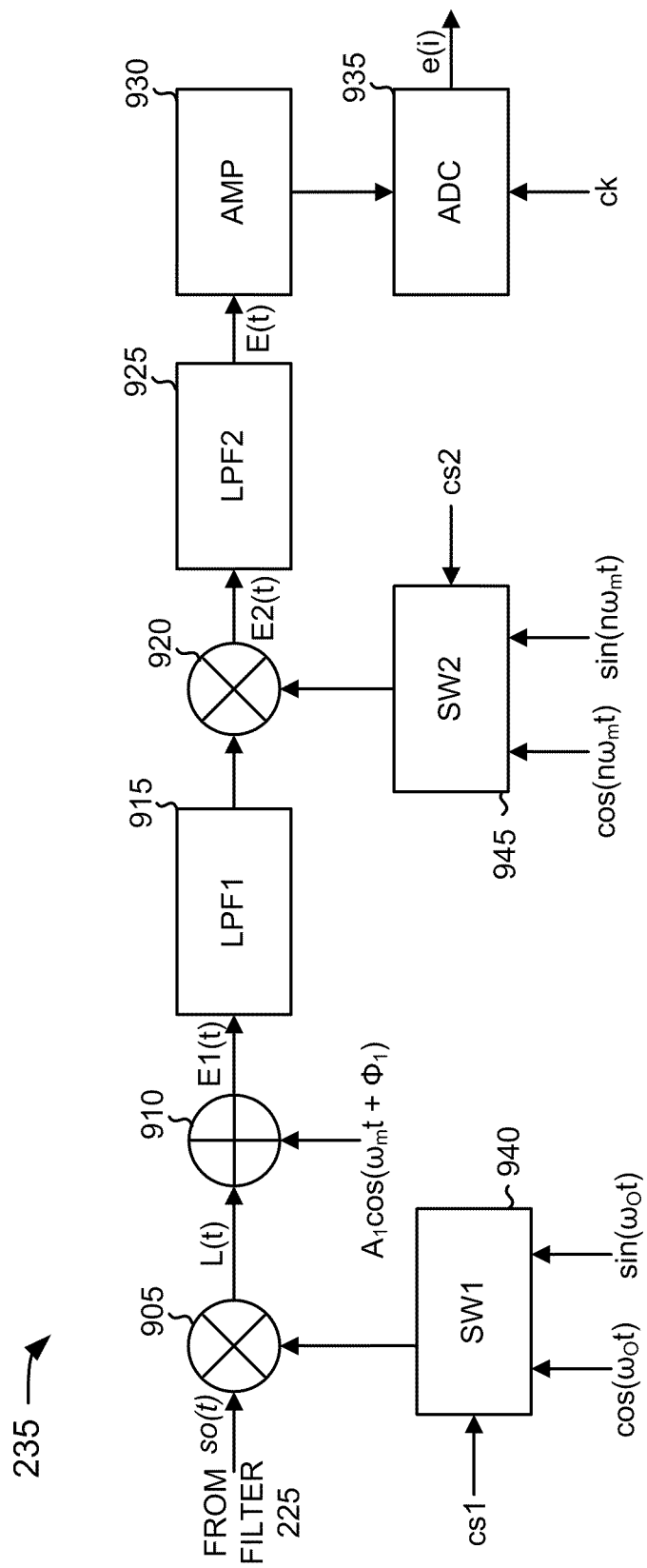
FIG. 9 is a diagram illustrating an exemplary implementation of a tone detection circuit.

FIG. 9 is a diagram illustrating an exemplary implementation of tone detection circuit 235. In general, tone detection circuit 235 may sequentially (i.e., one at a time) detect unwanted tones. The detected tone information is input to controller 240, which uses the information relating to the unwanted tones to control DPGs 205 to pre-distort the modulation signal.

Tone detection circuit 235, as shown in FIG. 9, includes a series connected first mixer 905, adder 910, first low pass filter (LPF1) 915, second mixer 920, second low pass filter (LPF2) 925, amplifier (AMP) 930, and analog-to-digital converter (ADC) 935. First local oscillator clock signals at frequency $f_0$ may be input to first mixer 905 via a first switch (SW1) 940. A variable signal at a selectable frequency of n-times the modulation signal frequency ($nf_m$, where n is an integer) may be input to second mixer 920 via a second switch (SW2) 945.

In operation, first switch 940 may receive local oscillator signals $\cos(\omega_o t)$ and $\sin(\omega_o t)$, at the same frequency $f_o$ as the local quadrature RF clock signals, and output one of the signals based on a switch selection signal cs1. First mixer 905 down converts the input signal based on the local oscillator signal from first switch 940 to down-converted signal L(t). Adder 910 may then add a fundamental modulation signal to L(t), to remove the down-converted wanted tone in the RF clock signal and generate signal E1($t$). First low pass filter 915 may remove high frequency harmonics from E1($t$). The signal output from first low pass filter 915 may be further down converted into error signal E2($t$) by second mixer 920. Signal E2($t$) may represent a baseband version, around DC, of the particular unwanted tone that is being detected. Second mixer 920 may receive the output of first low pass filter 915 and the output of second switch 945. Second switch 945 may output, based on selection signal cs2, either $\cos(n\omega_m t)$ or $\sin(n\omega_m t)$. The signals input to second switch 945 are low frequency clock signals having frequencies at the harmonics of the modulation clock frequency, i.e., $nf_m$, where n is an integer (e.g., n=0, 1, 2, 3, 4, 5). The value of n may be sequentially varied by controller 240 to perform tone detection for different modulation clock frequency harmonics.

Second low pass filter 925 may remove ripples in signal E2($t$) to create a clean signal E(t). The DC component of E(t) may represent the residual error signal. Amplifier 930 may boost the residual error signal and analog-to-digital converter 935 may convert the residual error signal to digital output data, e(i), which is sampled and quantized at discrete times based on sampling clock signal ck.

The two input signals to second switch 945 may be selected based on which of the quadrature components of the tone is to be detected. Controller 240 may control second switch 945 to select the input clock signal for second mixer 920 in an interleaved manner. Controller 240 may calculate the amplitude of the interleaved quadrature residual signals $e_i(i)$ and $e_q(i)$ as $$e_{amp}(i) = \sqrt{e_i(i)^2 + e_q(i)^2}.$$

The phase of the residual error may be calculated as $$e_{ang}(i) = \arctan\left(\frac{e_i(i)}{e_q(i)}\right).$$

The residual error amplitude and phase can be used to estimate the required pre-distortion amplitude and phase.

First switch 940 may be used in a similar manner for the local oscillator signal input to first mixer 905. First switch 940 may be switched based on the component of the unwanted tone that is being detected so the tone detection can work in an interleaved mode for detecting in-phase and quadrature phase components of the unwanted tone. In second switch 945, the parameter n can be set for a particular tone. For example, n is set to zero in order to detect phase and amplitude of the local oscillator leakage.

Figure 10:
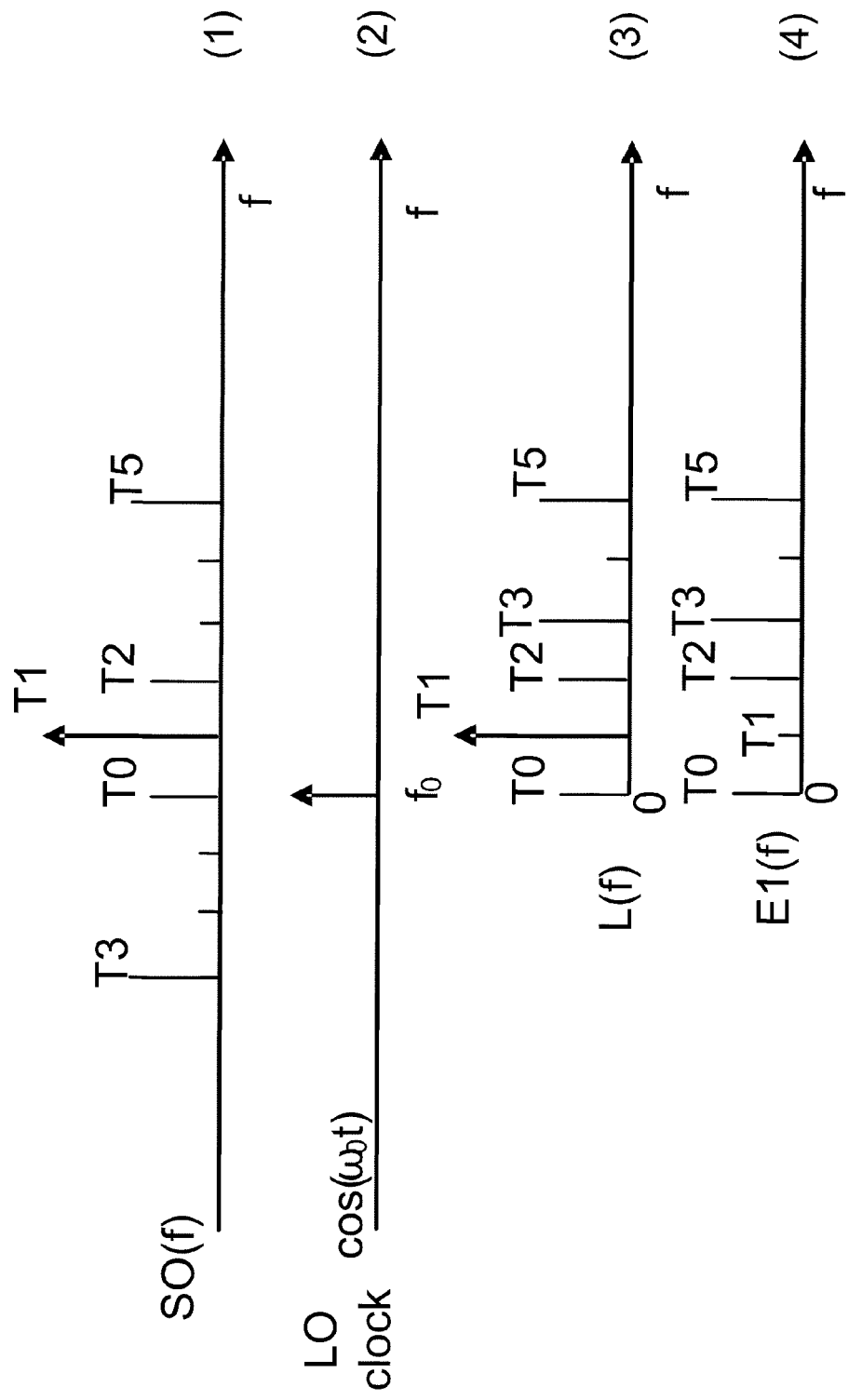
FIG. 10 is a diagram illustrating exemplary frequency spectrums of various signals in a tone detection circuit.

FIG. 10 is a diagram illustrating exemplary frequency spectrums of various signals in tone detection circuit 235. In particular, from top to bottom, the following frequency spectrums are shown: (1) the frequency spectrum, SO(f), of the generated RF clock signal, so(t), the input to tone detection circuit 235; (2) the frequency spectrum of the local oscillator clock; (3) the frequency spectrum, L(f), of signal L(t); and the frequency spectrum, E1(f), of signal E1(t).

The frequency spectrum SO(f) of the input signal includes the desired tone, i.e, the generated RF clock signal, T1, and a number of unwanted tones (T0, T2, T3, and T5). Tone T0, for instance, may be created by local oscillator leakage or device mismatch. Tones T3 and T5, on the other hand, may be created by the odd orders of non-linearity of up-converter 220. Tone detection circuit 235 may be controlled by controller 240 to isolate, one at a time, tones T0 (n=0), T2 (n=2), T3 (n=3), and T5 (n=5). In this manner, error information corresponding to each of these unwanted tones may be generated and output to controller 240.

In frequency spectrum L(f), it can be seen that the wanted tone, T1, has a relatively large amplitude compared to the unwanted tones. The large amplitude of T1 may drive the circuits after first mixer 905 into non-linear operation. In order to avoid this, a tone at the same amplitude but opposite in phase may be injected by adder 910 to suppress this tone. The output frequency spectrum of adder 910, tone E1(f), illustrates suppression of tone T1. At this point, the signal can be further mixed by second mixer 920 to down-convert the chosen unwanted signal before low pass filtering to isolate the desired unwanted signal before it is amplified and digitally sampled.

In the exemplary implementation of tone detection circuit 235 in FIGS. 9 and 10, the local oscillator clock signal is used in first mixer 905 and T1 is down-converted into the modulation frequency $f_m$. The large tone, T1, is then removed in order to keep the circuit in a linear region.

In an alternative technique for implementing tone detection circuit 235, the generated clock signal may instead be self-mixed and down-converted to a DC signal, then detected in amplitude. As the signal is amplitude detected, T1 may then be removed by high pass (or band pass) filtering. In this situation, the amplitude of unwanted modulation tones can then be found either by directly feeding the signal to AD converters with sufficient bandwidth, or by feeding the signal to a chain similar to second mixer 920, low pass filter 925, amplifier 930, and analog-to-digital converter 935.

In another alternative technique for implementing tone detection circuit 235, instead of using a high speed ADC 935 (FIG. 9), high speed sample and hold circuits and a low speed ADC may instead be used. The sample and hold circuits are possible because the residual error signals are periodic.

Figure 11:
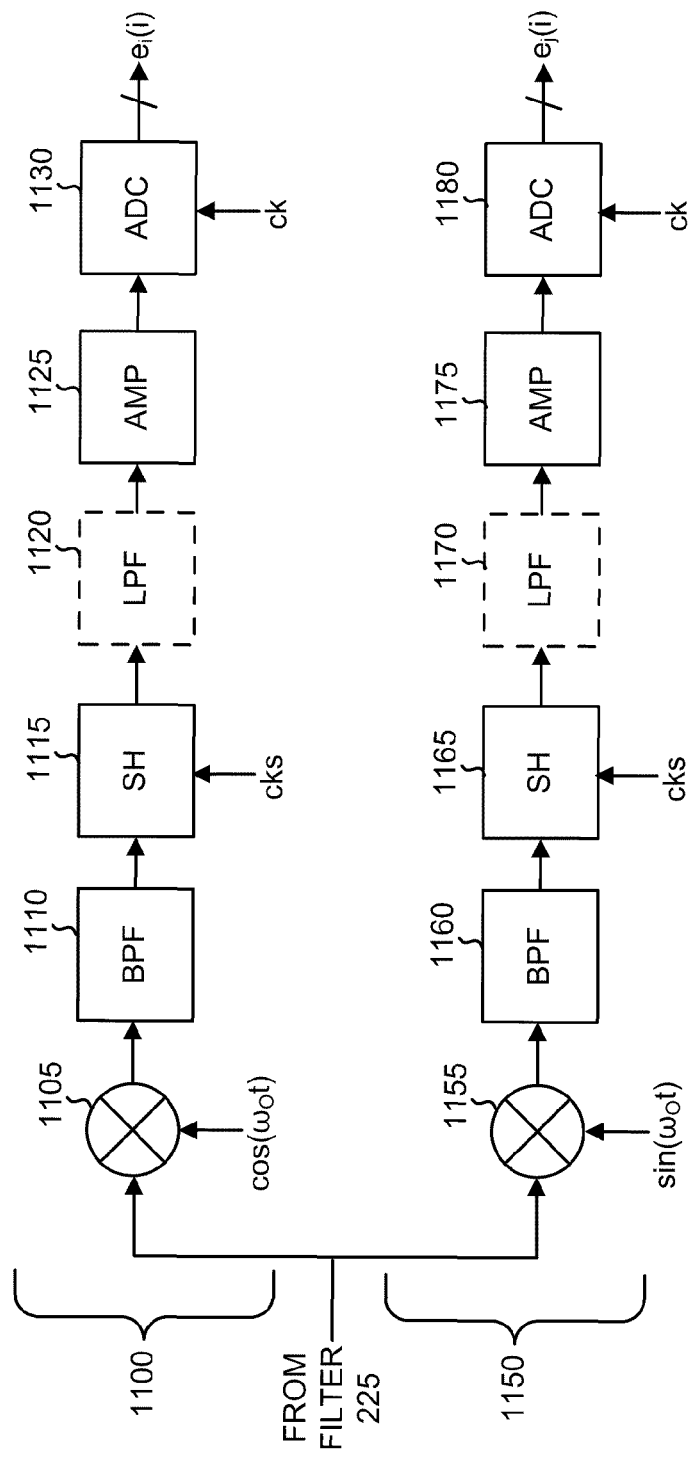
FIG. 11 is a diagram of an implementation of a tone detection circuit using sample and hold circuits and a single mixing stage.

FIG. 11 is a diagram of an implementation of tone detection circuit 235 using sample and hold circuits and a low speed ADC, in which only a single mixing stage is used. As shown, the input signal is provided through an upper circuit path 1100 and a lower circuit path 1150. Upper circuit path 1100 may include a mixer 1105, a low pass filter 1110 (LPF), a sample and hold circuit (SH) 1115, an optional low pass filter (LPF), an amplifier 1125, and a low speed analog-to-digital converter (ADC) 1130. Lower circuit path 1150 may similarly include a mixer 1155, a low pass filter 1160 (LPF), a sample and hold circuit (SH) 1165, an optional low pass filter (LPF) 1170, an amplifier 1175, and a low speed analog-to-digital converter (ADC) 1180. The input signal may be split between upper circuit path 1100 and lower circuit path 1150. In upper circuit path 1100, the input signal may be down-converted by mixer 1105, and then input to sample and hold circuit 1115. Sample and hold circuit 1115 may sample its input based on the clock signal cks. The clock signal cks may have a period that is close to a multiple (n) of the period of the modulation frequency, $f_m$. The output of sample and hold circuit 1115 may be filtered by low pass filter 1120, amplified by amplifier 1125, and converted to a digital representation by analog-to-digital converter 1130. Lower circuit path 1150 functions similarly to upper circuit path 1100, except that the signal input to mixer 1155 is in quadrature phase with respect to the signal input to mixer 1105.

Although FIGS. 9 and 11 show exemplary components of tone detection circuit 235, in other embodiments, tone detection circuit 235 may contain fewer, different, differently arranged, or additional components than depicted in FIGS. 9 and 11. For the two-chain structure of FIG. 11, it is also possible to merge the two chains together using a time interleaving method.

Figure 12:
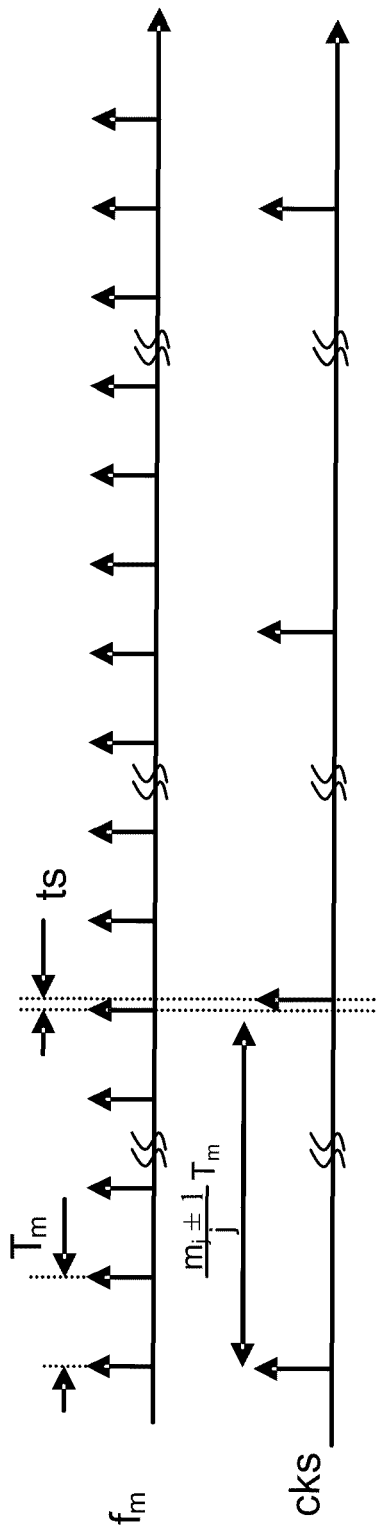
FIG. 12 is a diagram illustrating a timing relationship between a clock signal used to trigger sample and hold circuits and a modulation signal.

FIG. 12 is a diagram illustrating a timing relationship between the clock signal, cks, used to trigger sample and hold circuits 1115 and 1165, and the modulation signal at frequency, $f_m$. The relationship between $f_2$ and cks may be defined by $$Ts = \left(m \pm \frac{1}{j}\right)T_m = \frac{mj \pm 1}{j}T_m$$

or, $$fs = \frac{j}{mj \pm 1}f_m,$$

where $f_s$ is the frequency of cks and $T_s$ is the period of cks, and where m and j are integers. When m>1, the sampling frequency is lower than $f_m$, so that sub-sampling is performed. When m=0, oversampling is performed, where $f_s$ is j times higher than $f_m$. Here j is the number of sampling points and may equal the product of all order numbers of the unwanted tones to detect. As such, sample-and-hold circuits 1115 and 1165 may sample the clock residual error signals every m periods. In addition, a skew of $\pm 1/jT_s$ may be introduced. For sampling of one complete period, j*m+1 periods at frequency $f_m$ may be needed.

With sub-sampling, analog-to-digital converters 1130 and 1180 may run at relatively low frequencies, reducing both power consumption and design requirements.

Controller 240 may generally operate to control DPGs 205 and tone detection circuit 235 to perform tone cancellation of unwanted signals in the output clock signal. Controller 240 may, for example, write data patterns to DPGs 205 so that DPGs 205 generate the distorted sinusoid signals designed to cancel the nonlinearities of up-converter 220. Controller 240 may also receive the digital residual error signals from tone detection circuit 235, and produce the pre-distorted error signals and modify or generate the data patterns for DPGs 205. Generation of the data patterns for DPGs 205 may be performed, for example, at calibration time or during normal operation.

Figure 13:
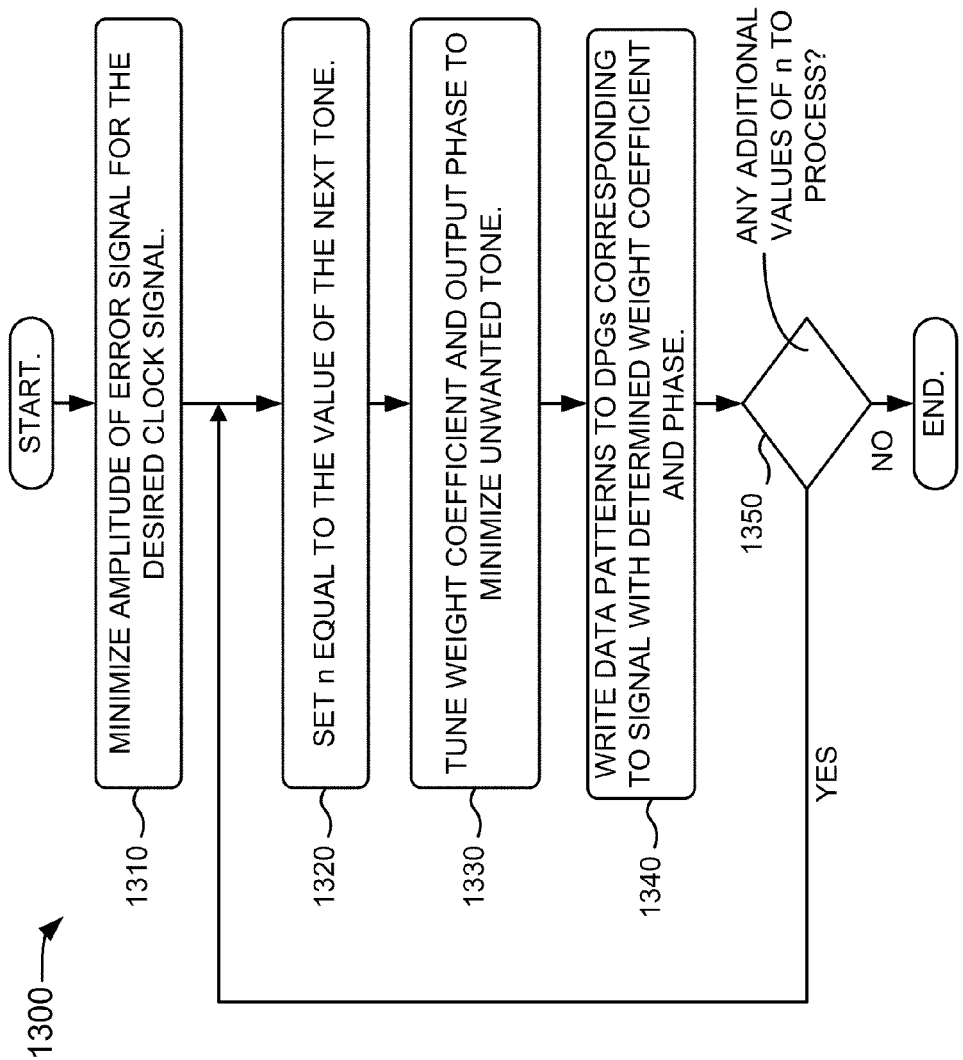
FIG. 13 is a flow chart illustrating an exemplary process for performing tone cancellation.

FIG. 13 is a flow chart illustrating an exemplary process 1300 for performing tone cancellation by controller 240.

Process 1300 may include minimizing the amplitude of the residual error signal due to an unwanted tone for the desired RF clock signal (block 1310). The desired RF clock signal may correspond to the tone at n=1. In tone detection circuit 235, as shown in FIG. 9, for instance, controller 240 may set n=1 for the sinusoid signals input to mixer 920. Controller 240 may then adjust the weight coefficient ($A_1$) and the output phase ($\Phi_1$), which are used in the generated tone input to adder 910 (FIG. 9), so that the amplitude of the error signal is minimized. More particularly, controller 240 may minimize $e(i)=\sqrt{e_i(i)^2+e_q(i)^2}$.

Process 1300 may also include setting n equal to the value of a tone that is to be cancelled (block 1320). As previously discussed, the tones that may need to be cancelled are the tones in the set n={3, 5, 0, 2}. For example, n may be set to three. Tone detection circuit will then detect the tone at $f_c-4f_m$. Controller 240 may then tune the weight coefficient ($A_1$) and the output phase ($\Phi_1$), which are used in the generated tone input to adder 910 (FIG. 9), so that the amplitude of the error signal is minimized (block 1330). The data pattern for the signal having the determined weight coefficient and output phase may be written to DPGs 205 (block 1340).

The process shown in blocks 1320-1340 may be repeated for each tone that is to be cancelled, i.e., for each additional value of n (block 1350).

The cancellation results for process 1300 may depend on the sensitivity of tone detection circuit 135. Because the wanted clock signal is a deterministic signal, the output signal can be a DC signal and the sensitivity can be set to be relatively high. To avoid flicker noise, chopping can be used in the amplifier and the analog-to-digital converters. Another factor that can influence the tone cancellation is the accuracy of the generated cancellation tones. In one implementation, before applying pre-distortion the amplitude of the spurious tones were at least 40 dB lower than that of the created clock signal. Additional attenuation of 40 dB is then typically sufficient.

The techniques described above can be used in carrier aggregation, both in the receiver and transmitter. In carrier aggregation applications, several RF clock signals may be required for the Rx and/or the Tx chain in UE 110. Using a clock generator with tone cancellation may solve the issue of multiple RF clocks without degradation of the performance in the Rx (or Tx) chain.

Systems and/or methods described herein may generate multiple RF clock signals without needing a corresponding PLL for each clock signal. Instead, multiple high quality clock signals are generated using a single PLL in which tone cancellation is applied to the generated clock signals to clean unwanted tones in the clock signals. In the tone cancellation, unwanted tones are detected and the modulation signal is pre-distorted in a way designed to offset each of the unwanted tones. The tone cancellation can be used to cancel both unwanted modulation tones due to non-linearity of an up-converter and clock output leakage caused by device mismatch. Further, power consumption of tone detection circuit 235 may be relatively low, as tone detection circuit 235 may only need to be used occasionally, such as at a regular (small duty cycle) interval or at initial calibration. Although RF clock signals are referred here, the method and systems may be used to generate clock signals that have a desired frequency in the microwave range.

The foregoing description of embodiments provides illustration and description, but is not intended to be exhaustive or to limit the invention to the precise form disclosed. Modifications and variations are possible in light of the above teachings or may be acquired from practice of the invention. For example, while a series of blocks has been described with regard to FIG. 13, the order of the blocks may be modified in other embodiments. Further, non-dependent blocks may be performed in parallel. Even though particular combinations of features are recited in the claims and/or disclosed in the specification, these combinations are not intended to limit the invention. In fact, many of these features may be combined in ways not specifically recited in the claims and/or disclosed in the specification.

No element, block, or instruction used in the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A clock generation circuit for generating an RF clock signal, the clock generation circuit comprising:
a pattern generator to generate a pre-distorted version of a modulation signal from digital patterns stored by the pattern generator;
an up-converter to mix the pre-distorted version of the modulation signal and a radio frequency local oscillator signal to generate the RF clock signal including a wanted tone corresponding to a desired frequency;
a notch filter to filter the RF clock signal, wherein the notch filter is constructed to suppress a third order harmonic tone of the RF clock signal to prevent additional modulation tones introduced by a following clock driver or clock divider;
a tone detection circuit to receive the filtered RF clock signal and to detect both amplitudes and phases corresponding to each of one or more unwanted tones having frequencies different from the desired frequency and being included in the RF clock signal;
and
a controller to generate pre-distortion data based on the detected amplitudes and phases and to control the pattern generator to generate the pre-distorted version of the modulation signal based on the pre-distortion data and to control the tone detection circuit to sequentially detect a plurality of the unwanted tones in the filtered RF clock signal;
wherein the pattern generator additionally includes a pair of pattern generators to respectively generate an in-phase pre-distorted version of the modulation signal and a quadrature pre-distorted version of the modulation signal; and the tone detection circuit includes:
a first mixer to receive the filtered RF clock signal as an input signal and down-convert the input signal based on the radio frequency local oscillator signal; and
a second mixer to convert the down converted input signal to a signal that includes a baseband representation of one of the unwanted tones; and
the controller controls the tone detection circuit with a variable signal at a selectable frequency of n-times a modulation signal frequency of the modulation signal, the variable signal being input to the second mixer and having frequencies at n harmonics of the modulation signal frequency, where n is a value sequentially varied by the controller to perform tone detection for different modulation signal frequency harmonics.

2. The clock generation circuit of claim 1, where the pattern generator additionally includes:
a plurality of random access memories, each of the random access memories storing a pattern, of the digital patterns, corresponding to a tone; and
an adder for digitally summing outputs of each of the plurality of random access memories to generate the pre-distorted version of the modulation signal.

3. The clock generation circuit of claim 1, where the pattern generator additionally includes:
a first random access memory to store the patterns, each of the patterns corresponding to a tone of a plurality of tones;
a second random access memory to store the pre-distortion data corresponding to one of the plurality of tones; and
an adder for digitally summing outputs from the first random access memory and the second random access memory, where at least some of the outputs of the adder are written back to the first random access memory.

4. The clock generation circuit of claim 1, further comprising:
a digital-to-analog converter to receive the pre-distorted version of a modulation signal from the pattern generator and to output an analog version of the pre-distorted modulation signal; and
a low pass filter to receive the analog version of the pre-distorted modulation signal and output a low pass filtered signal to the up-converter.

5. The clock generation circuit of claim 1, where the notch filter is implemented in combination with a band pass filter constructed to pass a frequency corresponding to the desired frequency of the RF clock signal.

6. The clock generation circuit of claim 1, where the controller controls the tone detection circuit to detect the amplitudes and phases during initial calibration or operation mode test of the clock generation circuit.

7. The clock generation circuit of claim 1, wherein the radio frequency local oscillator signal connected to the first mixer is replaced with the filtered RF clock signal, thereby forming a self-mixing to convert the filtered RF clock signal to baseband signal, which is amplitude detected.

8. The clock generation circuit of claim 1, further comprising a combiner to combine the down-converted RF clock signal with the modulation signal to remove the down-converted wanted tone in the filtered RF clock signal.

9. The clock generation circuit of claim 1, where the clock generator is implemented in an electronic device, a wireless communication terminal, or a transceiver in a base station, in radio frequency spectrum or microwave frequency spectrum.

10. A method of producing an RF clock signal, the method comprising:
mixing a pre-distorted modulation signal and a radio frequency local oscillator signal to obtain the RF clock signal including a desired frequency tone;
sequentially detecting amplitudes and phases corresponding to each of a plurality of unwanted frequency tones in the RF clock signal, the plurality of unwanted frequency tones having frequencies different from the desired frequency tone;
generating pre-distortion data based on the detected amplitudes and phases of the plurality of unwanted frequency tones;
filtering the RF clock signal, using a notch filter, to reduce a presence of a third order harmonic tone in the RF clock signal to prevent additional modulation tones introduced by a following clock driver or clock divider;
writing data patterns, based on the pre-distortion data, to a memory that is used to generate the pre-distorted modulation signal, the data patterns, when read out from the memory, including amplitude and phase values designed to cancel the plurality of unwanted frequency tones in the filtered RF clock signal; and
wherein writing data patterns includes generating an in-phase pre-distorted modulation signal and a quadrature pre-distorted modulation signal; and detecting amplitudes and phases corresponding to each of the plurality of unwanted frequency tones includes:
mixing the filtered RF clock signal and the radio frequency local oscillator signal so as to generate a down-converted RF clock signal using a variable signal at a selectable frequency of n-times a modulation signal frequency of the modulation signal, the variable signal having frequencies at n harmonics of the modulation signal frequency, where n is a value sequentially varied to perform tone detection for different modulation signal frequency harmonics; and
generating a baseband representation of one of the unwanted frequency tones based on the down-converted RF clock signal.

11. The method of claim 10, further comprising:
converting the pre-distorted modulation signal to an analog signal; and
filtering the converted analog signal using a low pass filter.

12. The method of claim 10, further comprising: band pass filtering the RF clock signal to pass the frequency tone equal to the desired frequency.

13. A mobile terminal comprising:
an antenna;
a processing system to control the operation of the mobile terminal; and
a transceiver component, connected to the processing system and the antenna, to wirelessly send and receive data, the transceiver component including a clock generation circuit for generating an RF clock signal, the clock generation circuit including
an up-converter configured to mix a pre-distorted modulation signal and a radio frequency local oscillator signal to obtain the RF clock signal including a desired frequency tone;
a pattern generator to generate the pre-distorted modulation signal from stored digital patterns, the pre-distorted modulation signal being generated to include pre-distortions to cancel effects of nonlinearities of the up-converter;
a notch filter to filter the RF clock signal, wherein the notch filter is constructed to suppress a third order harmonic tone of the RF clock signal to prevent additional modulation tones introduced by a following clock driver or clock divider;
a tone detection circuit to receive the filtered RF clock signal and to detect amplitudes and phases corresponding to each of one or more unwanted tones in the filtered RF clock signal, the one or more unwanted tones having frequencies different from the desired frequency tone; and
a controller to control the pattern generator to generate the pre-distortions in the modulation signal to cancel the detected unwanted tones, the pre-distortions being generated based on the detected amplitudes and phases, and to control the tone detection circuit to sequentially detect a plurality of the unwanted tones in the filtered RF clock signal;

wherein the pattern generator includes a pair of pattern generators to respectively generate an in-phase pre-distorted modulation signal and a quadrature pre-distorted modulation signal; and the tone detection circuit includes:

a first mixer to receive the filtered RF clock signal as an input signal and down-convert the input signal based on the radio frequency local oscillator signal; and a second mixer to convert the down converted input signal to a signal that includes a baseband representation of one of the unwanted tones; and the controller controls the tone detection circuit with a variable signal at a selectable frequency of n-times a modulation signal frequency of the modulation signal, the variable signal being input to the second mixer and having frequencies at n harmonics of the modulation signal frequency, where n is a value sequentially varied by the controller to perform tone detection for different modulation signal frequency harmonics.

* * * * *